(12) United States Patent
Gipson et al.

(10) Patent No.: US 10,219,368 B1
(45) Date of Patent: Feb. 26, 2019

(54) LAMINATED LIGHT GUIDE AND CARRIER HAVING A CIRCUIT BOARD WITH LIGHT EMITTING DIODES AND THROUGH BORES WITH A LIGHT GUIDE DISPOSED THEREIN WITH AN OPAQUE FILM OVERLAPPING THE THROUGH BORE

(71) Applicant: Dura Operating, LLC, Auburn Hills, MI (US)

(72) Inventors: Ron G. Gipson, Metamora, MI (US); Bhanumurthy Veeragandham, Auburn Hills, MI (US)

(73) Assignee: DURA OPERATING, LLC, Auburn Hills, MI (US)

( * ) Notice: Subject to any disclaimer, the term of this patent is extended or adjusted under 35 U.S.C. 154(b) by 0 days.

(21) Appl. No.: 15/852,390

(22) Filed: Dec. 22, 2017

(51) Int. Cl.
    H05K 1/02       (2006.01)
    F21V 8/00       (2006.01)
    H05K 1/18       (2006.01)

(52) U.S. Cl.
    CPC ......... *H05K 1/0274* (2013.01); *G02B 6/0021* (2013.01); *G02B 6/0031* (2013.01); *G02B 6/0065* (2013.01); *H05K 1/18* (2013.01)

(58) Field of Classification Search
    CPC .. H05K 1/0274; F21Y 2115/10; H03K 17/962
    See application file for complete search history.

(56) References Cited

U.S. PATENT DOCUMENTS

| 7,923,654 | B2 * | 4/2011 | Zeijlon | H03K 17/962 |
| | | | | 200/313 |
| 9,869,810 | B2 | 1/2018 | Keranen et al. | |
| 10,091,887 | B2 * | 10/2018 | Heikkinen | H05K 1/0274 |
| 2015/0308639 | A1 | 10/2015 | Keranen et al. | |
| 2016/0295702 | A1 | 10/2016 | Heikkinen et al. | |
| 2016/0345437 | A1 | 11/2016 | Heikkinen et al. | |

FOREIGN PATENT DOCUMENTS

| WO | 2017077193 A1 | 5/2017 |
| WO | 2017178701 A1 | 10/2017 |
| WO | 2017178702 A1 | 10/2017 |
| WO | 2017178703 A1 | 10/2017 |

OTHER PUBLICATIONS

US 9,915,556, 03/2018, Keränen et al. (withdrawn)

* cited by examiner

*Primary Examiner* — Robert J May
(74) *Attorney, Agent, or Firm* — Robert E. Ford; Raymond J. Vivacqua; Steven L. Crane (57) ABSTRACT

A laminated light guide and component carrier includes a printed circuit board having a light emitting diode connected to a first face of the printed circuit board. A through bore is created in the printed circuit board proximate to the light emitting diode. An opaque film is applied using an adhesive to a second face of the printed circuit board oppositely directed with respect to the first face, the opaque film having a portion overlapping the through bore. A light guide is positioned within the opening and affixed to the portion of the opaque film overlapping the through bore. A white film is applied or ink printed onto the light guide without contacting the first face of the printed circuit board.

20 Claims, 6 Drawing Sheets

LAMINATED LIGHT GUIDE AND CARRIER HAVING A CIRCUIT BOARD WITH LIGHT EMITTING DIODES AND THROUGH BORES WITH A LIGHT GUIDE DISPOSED THEREIN WITH AN OPAQUE FILM OVERLAPPING THE THROUGH BORE

FIELD

The present disclosure relates generally to the fabrication of printed circuit board parts with electronic components and particularly backlit components embedded in a molded plastic.

BACKGROUND

The statements in this section merely provide background information related to the present disclosure and may or may not constitute prior art.

Electronic assemblies with backlit visual elements may be manufactured via several processes. Most commonly, a plastic part is molded with some portion of the plastic being clear or translucent, with electronic components including one or more light sources attached mechanically to the part after molding, so that light is visible through the clear or translucent portion, resulting in a backlighting effect. More recently, methods have been developed of embedding one or more light sources in a molded plastic part. One such method is to encapsulate light sources and associated electronic components (collectively "package") in a clear resin via low-pressure molding and then to injection-mold plastic over or around the encapsulated package. The encapsulated package is thereby embedded in the plastic, with some portion of the plastic being clear or translucent so that light from the encapsulated package is visible through the clear or translucent plastic, resulting in a backlighting effect.

Another such method is to mount light sources and associated electronics ("package") onto a polymer film, form the film into a desired shape, insert the formed film into an injection mold having substantially the same shape, and then injection-mold plastic onto the film such that the package is embedded between the film on which it is mounted and the plastic that has been molded onto it, with portions of the film and/or plastic being clear or translucent such that light from the light sources is visible from the part exterior, resulting in a backlighting effect.

Electronic components may also be printed onto a film. The film is then inserted into an injection mold, where plastic is molded onto the film, the electronic components being embedded in the molded plastic so that when the plastic part is removed from the mold the film is peeled away from the plastic part, leaving the electronic components embedded in or adhered to the surface of the plastic part.

While current printed circuit board parts with electronic components including backlit components are satisfactory, this field can benefit from the improved laminated light guide and component carrier of the present disclosure.

SUMMARY

According to several aspects, a laminated light guide and component carrier includes a printed circuit board having a light emitting diode connected to a first face of the printed circuit board. A through bore is created in the printed circuit board located proximate to the light emitting diode. An opaque film is applied to a second face of the printed circuit board oppositely directed with respect to the first face and having a portion partially overlapping the through bore. A light guide has a first portion for receiving light from the light emitting diode and a second positioned within the through bore and contacting the portion of the opaque film partially overlapping the through bore. The light guide transmits light from the light emitting diode through the bore and to the opaque film.

In another aspect of the present disclosure, a light reflector defines an area of the light guide having a texturally modified area.

In another aspect of the present disclosure, the light reflector is positioned in the light guide directly abutting the light emitting diode.

In another aspect of the present disclosure, the texturally modified area of the light guide is entirely within an envelope of the light guide.

In another aspect of the present disclosure, the light emitting diode is recessed partially within a cavity created in the first face of the printed circuit board and directly abuts the light guide; and a lens of the light emitting diode is positioned directly in alignment with the texturally modified area defining the light reflector.

In another aspect of the present disclosure, the light emitting diode is supported directly on the first face of the printed circuit board with the light guide extending above the first face of the printed circuit board and directly abutting the light emitting diode; and the light emitting diode includes a lens aligned with the texturally modified area defining the light reflector.

In another aspect of the present disclosure, a white film is applied or ink printed onto the light guide without contacting the first face of the printed circuit board.

In another aspect of the present disclosure, a touch capacitive circuit printed on the second face and positioned between the second face and the opaque film; and multiple electrical traces are printed on the second face connected to the touch capacitive circuit.

In another aspect of the present disclosure, the opaque film is applied to the second face of the printed circuit board using an adhesive, with the adhesive also present on the portion partially overlapping the through bore such that the light guide is connected to the portion of the opaque film using the adhesive.

In another aspect of the present disclosure, light generated by the light emitting diode is blocked from passing through the opaque film except at individual locations of indicia individually defining light transparent portions created in the opaque film.

According to several aspects, a laminated light guide and component carrier includes a printed circuit board having a light emitting diode connected to a first face of the printed circuit board. A through bore is created in the printed circuit board proximate to the light emitting diode. An opaque film is applied using an adhesive to a second face of the printed circuit board oppositely directed with respect to the first face, the opaque film having a portion overlapping the through bore. A light guide is positioned within the opening and affixed to the portion of the opaque film overlapping the through bore. A white film is applied or ink printed onto the light guide without contacting the first face of the printed circuit board.

In another aspect of the present disclosure, the light guide includes a light reflector defining an area of the light guide having a texturally modified area.

In another aspect of the present disclosure, the white film is positioned proximate to the light reflector to maximize light reflected toward an opening created in the opaque film.

In another aspect of the present disclosure, the light emitting diode includes a lens aligned with the texturally modified area defining the light reflector.

In another aspect of the present disclosure, the light guide is preformed to slidably fit within the through bore created in the printed circuit board and partially extends above the first face of the printed circuit board.

In another aspect of the present disclosure, the light emitting diode is recessed partially within a cavity created in the first face of the printed circuit board and directly abuts the light guide.

In another aspect of the present disclosure, the light guide is affixed about a perimeter of the light guide to the adhesive present on the portion of the opaque film partially overlapping the through bore.

According to several aspects, a laminated light guide and component carrier includes a printed circuit board having multiple light emitting diodes connected to a first face of the printed circuit board. Multiple through bores are created in the printed circuit board each positioned proximate to one of the light emitting diodes. An opaque film is applied to a second face of the printed circuit board oppositely directed with respect to the first face, the opaque film having multiple portions, each of the portions individually overlapping one of the through bores. Multiple light guides are each formed to be slidably received within one of the through bores and bonded about a perimeter of the light guide to the adhesive present on one of the multiple portions of the opaque film. The light guides each include a light reflector defining a texturally modified area. A white film is applied or ink printed onto each of the light guides without contacting the first face of the printed circuit board and positioned proximate to the light reflector of each of the light guides to maximize light reflected toward an opening created in the opaque film. An opaque polymeric material layer is commonly applied over the first face of the printed circuit board, the light emitting diodes, the light guides and each white film, and extends beyond a perimeter of the printed circuit board.

In another aspect of the present disclosure, multiple touch capacitive circuits are printed on the second face of the printed circuit board connected to touch capacitive second electrical traces. A touch capacitive sensor is positioned proximate to each of the touch capacitive circuits.

In another aspect of the present disclosure, a transparent cover layer is applied over the touch capacitive circuits and each touch capacitive sensor and onto the second face of the printed circuit board opposite to the first face and a portion of the opaque polymeric material layer extending beyond the perimeter of the printed circuit board.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
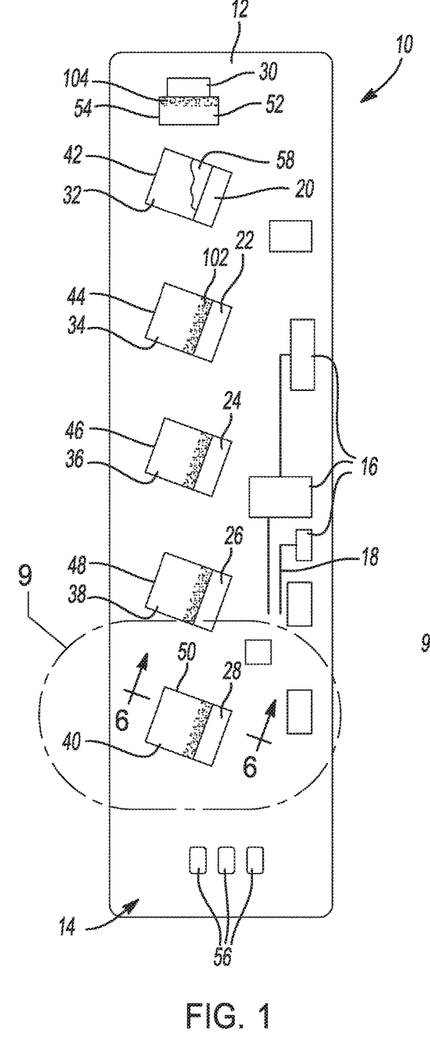
FIG. 1 is a top plan view of a first face of a laminated light guide and component carrier according to an exemplary embodiment.

Referring to FIG. 1, a laminated light guide and component carrier 10 includes a material printed circuit board 12, made for example from a copper material or a polycarbonate material. According to several aspects, the printed circuit board 12 defines a rectangular shape. On a first side or face 14 of the printed circuit board 12 are located multiple electronic components 16 including capacitors, which are electrically connected to a plurality of first electrical traces 18 printed for example by a screen printing process onto the first face 14. Multiple light emitting diodes 20, 22, 24, 26, 28 are individually mounted on the first face 14. An additional light emitting diode 30 can optionally be provided at one end of the printed circuit board 12 to provide an illuminated indication that electrical power is available for the laminated light guide and component carrier 10.

Positioned proximate to each of the light emitting diodes 20, 22, 24, 26, 28 and embedded in the printed circuit board 12 are individual light guides 32, 34, 36, 38, 40 each pre-molded for example from a substantially transparent or light transmissive polymeric material such as poly-methyl methacrylate (PMMA). Each of the light guides 32, 34, 36, 38, 40 is received in a concomitantly shaped through bore 42, 44, 46, 48, 50 pre-formed in the printed circuit board 12, and is adhesively retained as will be described in greater detail in reference to FIG. 5. An additional light guide 52 is provided proximate to the optional light emitting diode 30 when provided, and is received in an opening 54.

Also positioned on the first face 14 of the printed circuit board 12 are a plurality of contact pads 56 which are connected to the electrical traces 18. According to several aspects, a white film 58, only a portion of one of which is shown for clarity, is individually applied or ink printed over each of light guides 32, 34, 36, 38, 40 and the light guide 52, without contacting any portion of the first face 14 of the printed circuit board 12, or any other component mounted to the first face 14. Each white film 58 further enhances light reflection in the individual light guides 32, 34, 36, 38, 40, 52 for light generated by the light emitting diodes 20, 22, 24, 26, 28, 30.

Referring to FIG. 2 and again to FIG. 1, on a second face 60 of the printed circuit board 12 oppositely facing with respect to the first face 14 are printed multiple touch capacitive circuits 62, 64, 66, 68, 70 which are each connected to touch capacitive second electrical traces 72. The second electrical traces 72 are connected by apertures or vias extending through the printed circuit board 12 to the contact pads 56 positioned on the first face 14 of the printed circuit board 12. A touch capacitive sensor 74, 76, 78, 80, 82 is also positioned proximate to individual ones of the touch capacitive circuits 62, 64, 66, 68, 70, which are connected by electrical traces 84 to the contact pads 56.

Figure 2:
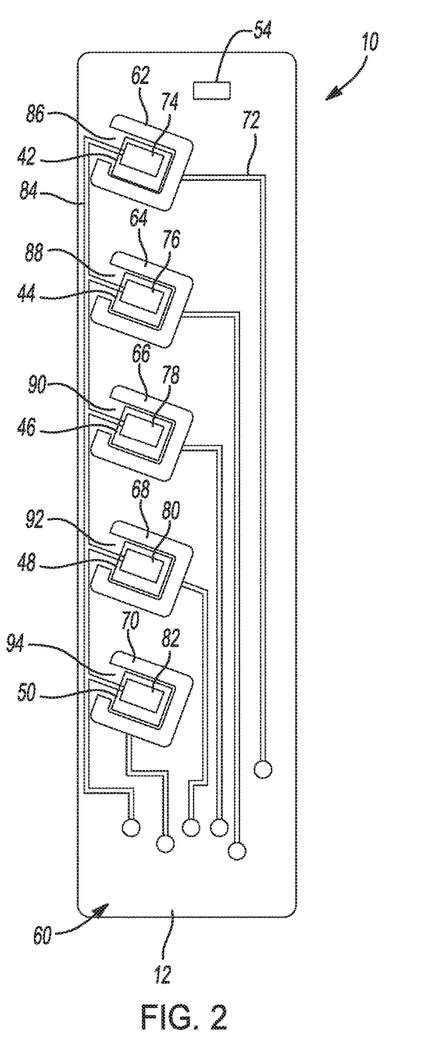
FIG. 2 is a bottom plan view of a second face of the laminated light guide and component carrier of FIG. 1 prior to installation of an opaque film.

A window region 86, 88, 90, 92, 94 unobstructed by direct through-passage of the electrical traces or the electrical components is maintained through the printed circuit board 12 proximate to each of the touch capacitive sensors 74, 76, 78, 80, 82, each aligned with one of the light guides 32, 34, 36, 38, 40. Each window region 86, 88, 90, 92, 94 permits light generated by one of the light emitting diodes 20, 22, 24, 26, 28 and reflected through one of the light guides 32, 34, 36, 38, 40 to pass unobstructed through the printed circuit board 12 to locations of multiple indicia described in reference to FIG. 3. A separate window region of the printed circuit board 12 is also maintained through the printed circuit board 12 to allow light generated by the light emitting diode 30 and reflected by the light guide 52 to pass through the printed circuit board 12.

Referring to FIG. 3 and again to FIGS. 1 through 2, a polymeric substantially opaque film 96 is applied for example by adhesive bonding to the second face 60 including onto the touch capacitive circuits 62, 64, 66, 68, 70, the electrical traces 72, the touch capacitive sensors 74, 76, 78, 80, 82, and the electrical traces 84. According to several aspects, the opaque film 96 contains a black ink rendering the opaque film 96 black in color. Light generated by any of the light emitting diodes 20, 22, 24, 26, 28, 30 of the printed circuit board 12 is blocked from passing through the opaque film 96 except at individual locations of multiple indicia 98. The indicia 98 are light transparent portions of the opaque film 96 rendered as successive number pairs, and are each individually aligned with one of the window regions 86, 88, 90, 92, 94 where maximum light enhancement is achieved by the light guides 32, 34, 36, 38, 40, 52. A separate window region 100 can be provided through the opaque film 96 for light generated by the light emitting diode 30.

Referring to FIG. 4 and again to FIG. 1, each of the light guides 32, 34, 36, 38, 40, 52 includes an area of the light guide having a "pebbled", texturally modified area or geometry proximate to each of the light emitting diodes 20, 22, 24, 26, 28. These pebbled, texturally modified areas each define a light reflector 102, which are features of the light guide itself created to locally enhance, reflect and scatter the light generated by the light emitting diodes 20, 22, 24, 26, 28. The texturally modified areas or light reflectors 102 are formed as texturally modified areas of portions of the light guide entirely within an envelope of each light guide, each proximate to one of the light emitting diodes 20, 22, 24, 26, 28. A separate light reflector 104 may also be provided in the light guide 52 positioned proximate to the light emitting diode 30, which is similar to the light reflectors 102 in design and function.

Figure 4:
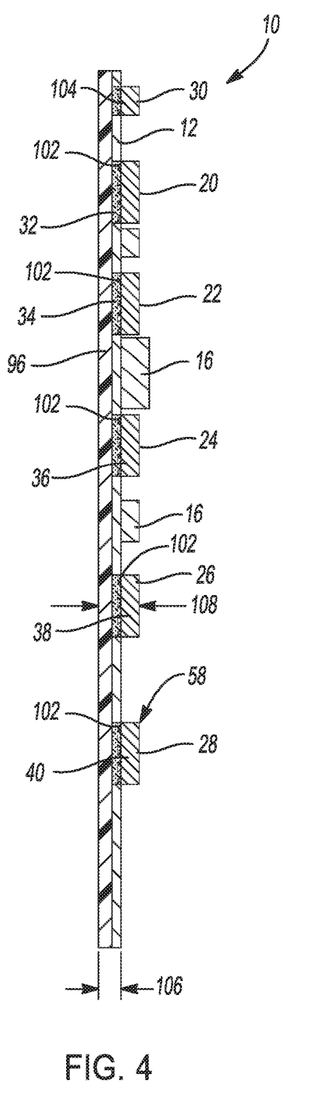
FIG. 4 is a side elevational view of the laminated light guide and component carrier of FIG. 1.

When completed the printed circuit board 12 and the opaque film 96 of the laminated light guide and component carrier 10 together have a thickness 106 of approximately 0.5 mm or less. A total thickness 108 of the laminated light guide and component carrier 10 including the printed circuit board 12 and the opaque film 96 at the locations of each of the light emitting diodes 20, 22, 24, 26, 28 is approximately 1.0 mm or less. These thicknesses provide for maximum flexibility to allow conforming the laminated light guide and component carrier 10 to a curved geometry for example of a trim component used in a motor vehicle "B" pillar.

Figure 3:
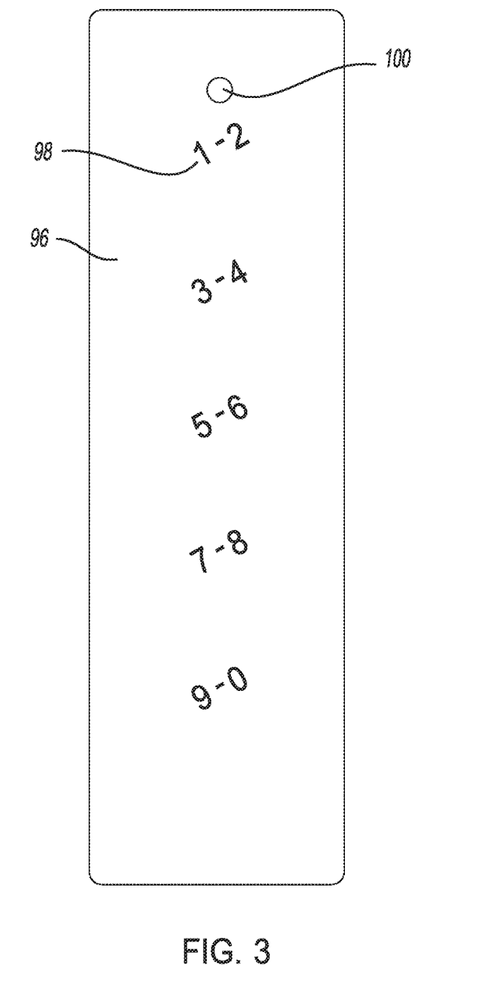
FIG. 3 is a plan view of an opaque film for application onto the second face of the laminated light guide and component carrier of FIG. 2.
Figure 5:
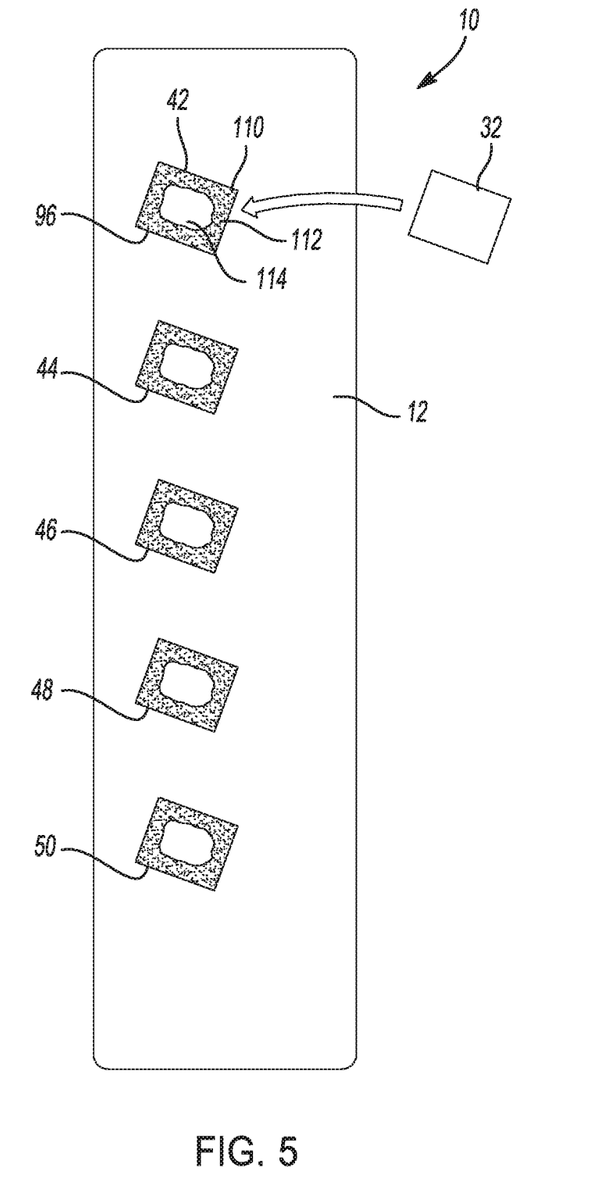
FIG. 5 is a top plan view of a portion of the laminated light guide and component carrier of FIG. 1 during a light guide installation step.

Referring to FIG. 5 and again to FIGS. 1 through 3, the following discussion of the through bore 42 applies equally to each of the other through bores 44, 46, 48, 50, 54 pre-formed in the printed circuit board 12. For clarity the printed circuit board 12 of the laminated light guide and component carrier 10 is shown without the electronic components 16, the light emitting diodes 20, 22, 24, 26, 28, 30, or the electrical traces 18. After application of the opaque film 96 onto the second face 60 of the printed circuit board 12, a portion 110 of the opaque film 96 partially overlaps and therefore extends partially into the through bore 42 pre-formed in the printed circuit board 12. An adhesive 112 on a surface of the opaque film 96 used to attach the opaque film 96 to the second face 60 is therefore also present at each portion 110 and faces toward the viewer as shown in FIG. 5. The adhesive 112 is available to contact a perimeter of the light guide 32 as described below.

A clear opening 114 is created in the portion 110 shaped to define the indicia 98 which allows light from the light emitting diode 20 positioned proximate to the through bore 42 to pass through the opaque film 96 of the laminated light guide and component carrier 10. The pre-formed light guide 32 is aligned with and positioned in the through bore 42 for example using a robot and adheres to the adhesive 112 exposed on the portion 110 to retain the light guide 32 in position.

Referring to FIG. 6 and again to FIGS. 1 through 5, a portion of the laminated light guide and component carrier 10 proximate to the light emitting diode 28 is depicted, however the following discussion applies equally to the areas proximate to each of the other light emitting diodes 20, 22, 24 and 26. According to several aspects the light emitting diode 28 may be recessed partially within a cavity 116 created in the first face 14 of the printed circuit board 12. According to several aspects, the light emitting diode 28 includes a lens 118 positioned directly in alignment with the texturally modified area defining one of the light reflectors 102 to maximize light reflection within the light guide 40. According to further aspects, the light guide 40 is preformed to slidably fit within the through bore 50 created in the printed circuit board 12 and may be substantially co-planar with the first face 14 of the printed circuit board 12 in the installed position shown.

Figure 6:
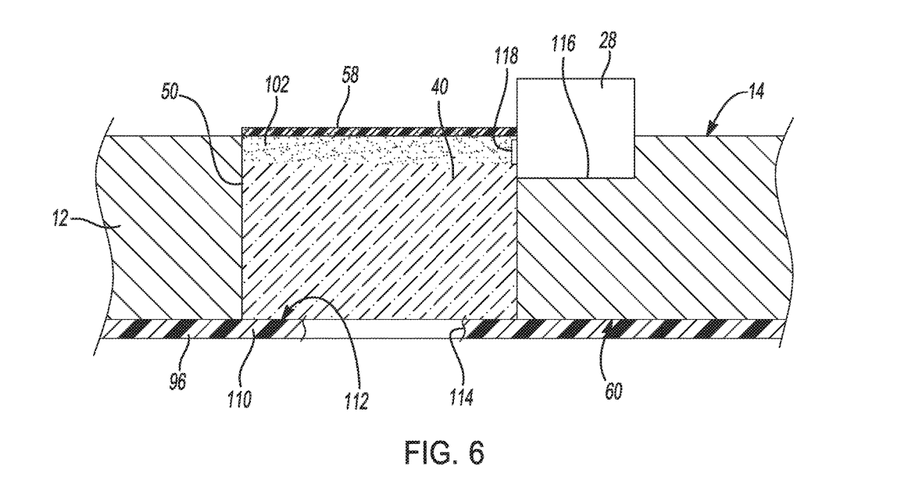
FIG. 6 is a cross sectional elevational view taken at section 6 of FIG. 1.

The texturally modified area defining one of the light reflectors 102 is located entirely within a space envelope defining a first portion of the light guide 40 positioned proximate to the white film 58 to maximize light reflection toward the clear opening 114 created in the portion 110 of the opaque film 96 shaped to define the indicia 98 which allows light from the light emitting diode 28 passing through a second portion of the light guide 40 positioned within the through bore 50 and located proximate to the opaque film 96 to pass through the opaque film 96. As previously noted, according to several aspects the entire light guide 40 is positioned within the through bore 50 pre-formed in the printed circuit board 12 and is held in position by the adhesive 112 which also attaches the opaque film 96 to the second face 60 of the printed circuit board 12.

Referring to FIG. 7 and again to FIGS. 1 through 6, according to several aspects, a portion of the laminated light guide and component carrier 10 proximate to the light emitting diode 28 is depicted, however the following discussion applies equally to the areas proximate to each of the other light emitting diodes 20, 22, 24 and 26. According to several aspects a first portion of the light emitting diode 28 is supported directly on the first face 14 of the printed circuit board 12, while a second portion is positioned within the through bore 50. To align the light guide 40' to receive light from the light emitting diode 28, the light guide 40' is modified from the light guide 40 such that the first portion of the light guide 40' defines a shoulder 120 extending above or away from the first face 14. The lens 118 of the light emitting diode 28 aligns with the texturally modified area defining one of the light reflectors 102 within the shoulder 120 of the light guide 40' extending above the first face 14 to maximize light reflection within the light guide 40'.

Figure 7:
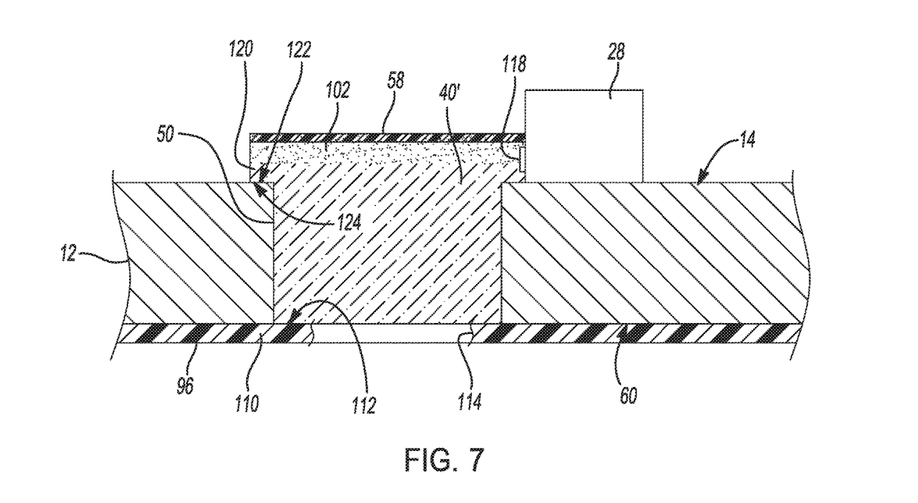
FIG. 7 is a cross sectional elevational view similar to FIG. 6 showing an additional aspect.

The texturally modified area defining one of the light reflectors 102 is located entirely within a space envelope of the shoulder 120 of the light guide 40' and is positioned proximate to the white film 58 to maximize light reflection toward the clear opening 114 created in the portion 110 of the opaque film 96 shaped to define the indicia 98 which allows light from the light emitting diode 28 positioned proximate to the through bore 50 to pass through the opaque film 96.

According to several aspects, the second portion of the light guide 40' is positioned within the through bore 50 pre-formed in the printed circuit board 12 and is held in position by the adhesive 112 which also attaches the opaque film 96 to the second face 60 of the printed circuit board 12. At least a width and according to several aspects both the width and a length of the first portion or shoulder 120 of the light guide 40' is larger than a width and length of the second portion of the light guide 40' positioned within the through bore 50. The shoulder 120 therefore rests on a corner portion 122 of the first face 14 of the printed circuit board 12 such that a shoulder face 124 of the shoulder 120 contacts the corner portion 122. The shoulder 120 of the light guide 40' therefore both extends above the first face 14 and supports the light guide 40' on the first face 14 of the printed circuit board 12 in the installed position shown. The light guide 40' is therefore supported both by the opaque film 96 and the first face 14 of the printed circuit board 12.

Referring to FIG. 8 and again to FIGS. 1 through 4, after completion of the laminated light guide and component carrier 10, a completed assembly 126 is created by positioning the laminated light guide and component carrier 10 into a mold wherein a polymeric material such as acrylonitrile butadiene styrene (ABS) is injected to create a non-light transparent or opaque layer 128 over the components and features on the first face 14 and extends beyond a perimeter of the printed circuit board 12 of the laminated light guide and component carrier 10.

Figure 8:
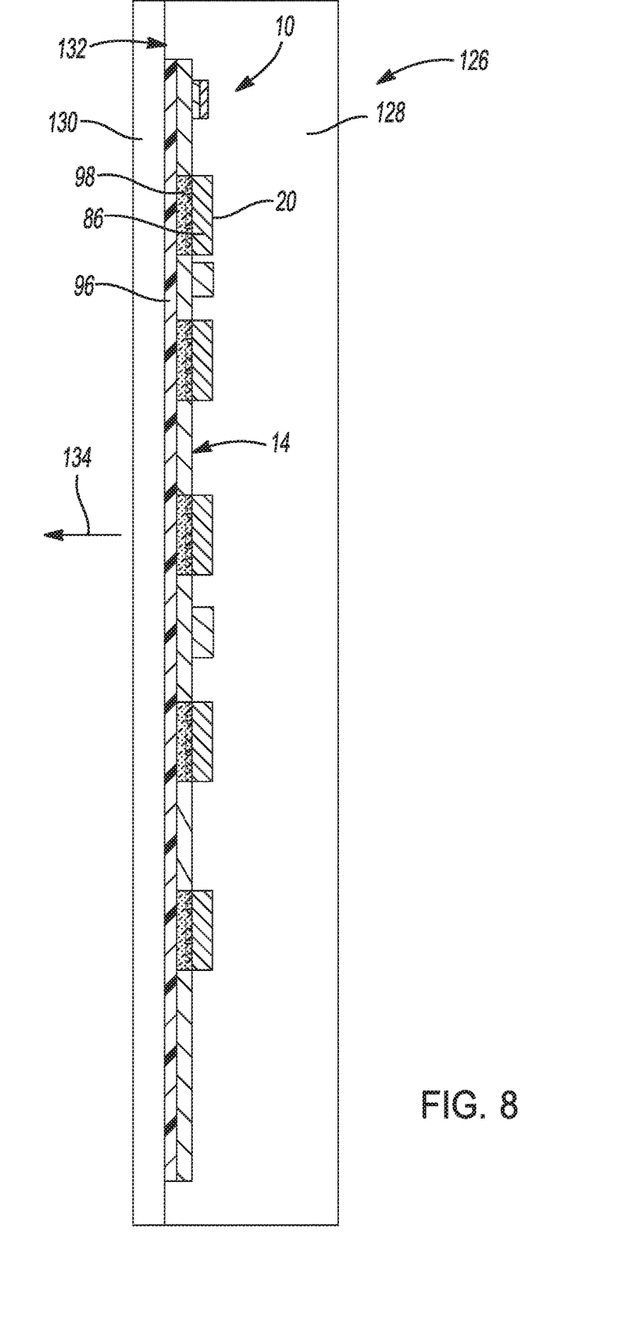
FIG. 8 is a side elevational view of the laminated light guide and component carrier of FIG. 4 after installation of an opaque film layer and an opposite clear film layer.

A clear or substantially transparent layer 130 of a polymeric material such as poly-methyl methacrylate (PMMA) is then injection molded onto the opaque film 96 and onto a surface 132 of the opaque layer 128 which is substantially co-planar with an outside face of the opaque film 96. The transparent layer 130 allows light transmission in a transmission direction 134 from light generated by any one of the light emitting diodes 20, 22, 24, 26, 28, 30 to be transmitted via the light guides 34, 36, 38, 40, 52 through one of the light reflectors 102, 104 and through the transparent layer 130. A specific one of the light emitting diodes which is energized such as the light emitting diode 20 back-illuminates a particular indicium such as the indicium 98 of one of the window regions such as the window region 86 described in reference to FIG. 2.

Figure 9:
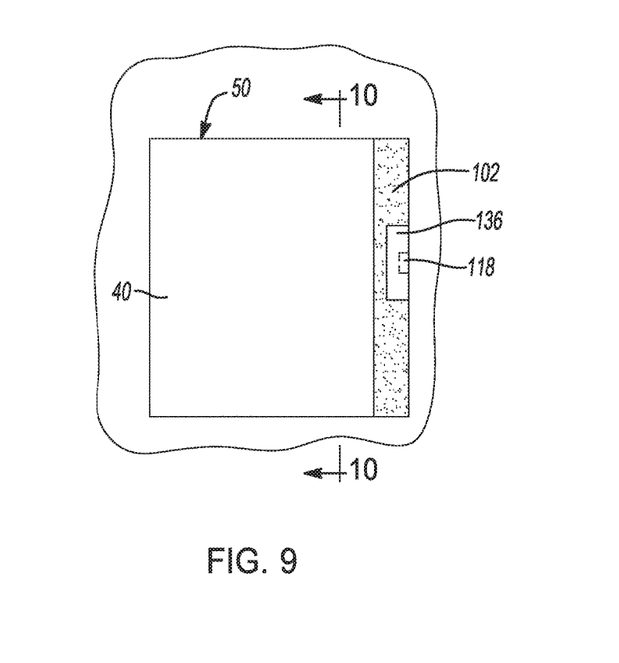
FIG. 9 is a top plan view of a light guide shown in area 9 of FIG. 1.

Referring to FIG. 9 and again to FIGS. 1 through 8, each of the light guides 32, 34, 36, 38, 40, 52 such as the light guide 40 shown can further include a recess or pocket 136 within the region defining the light reflector 102, or the light reflector 104. The pocket 136 is positioned to receive at least a portion of one of the light emitting diodes 20, 22, 24, 26, 28, or 30. This permits the lens 118 of each light emitting diode to be located within a thickness of the light guide and therefore more closely aligned with the light reflector 102, 104 for maximum light reflection into the proximate one of the light guides 32, 34, 36, 38, 40, or 52.

Referring to FIG. 10 and again to FIGS. 1 through 9, the following discussion of the light guide 40 applies equally to each of the other light guides 32, 34, 36, 38, 52. The white film 58 is individually applied or ink printed over the surface of the light guide 40. According to several aspects the shoulder 120 defining a first portion 138 of the light guide 40 is supported directly on the first face 14 of the printed circuit board 12 while a second portion 140 of the light guide 40 is positioned within the through bore 50. The second portion 140 of the light guide extends entirely through the printed circuit board 12 and contacts the opaque film 96 and may be retained by the adhesive present on the opaque film 96. The lens 118 of the light emitting diode 28 aligns with the texturally modified area defining one of the light reflectors 102 which is positioned proximate to the shoulder 120 of the light guide 40 extending above the first face 14 to maximize light reflection within the light guide 40.

Figure 10:
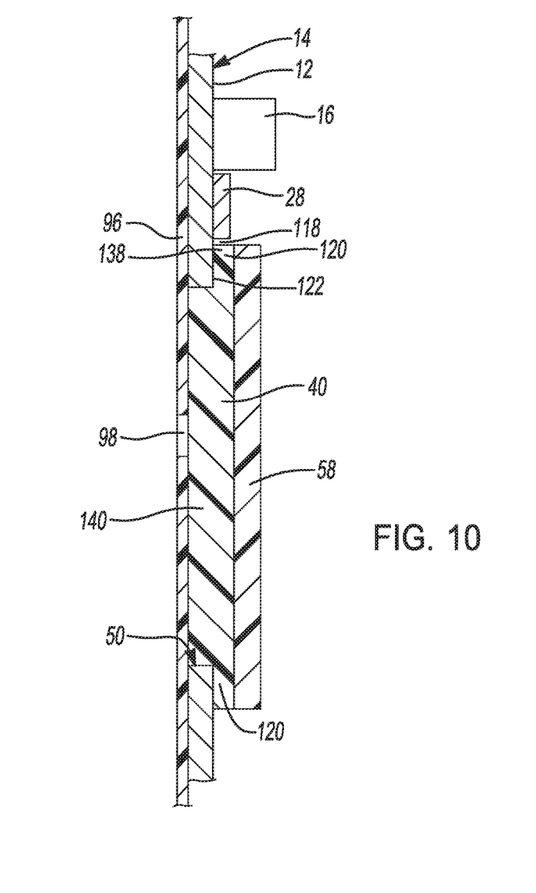
FIG. 10 is a cross sectional end elevational view taken at section 10 of FIG. 9.

The texturally modified area defining the light reflector 102 is positioned proximate to the white film 58 to maximize light reflection into the through bores such as the through bore 50 created in the printed circuit board 12, allowing light generated by the light emitting diode 28 to pass through the second portion 140 of the light guide 40 within the through bore 50 and through the portion of the opaque film 96 shaped to define the indicia 98. This allows light from the light emitting diode 28 positioned proximate to the through bore 50 to pass through the opaque film 96.

According to several aspects, at least a width and according to several aspects both the width and a length of the first portion 138 defining the shoulder 120 of the light guide 40 is larger than a width and length of the second portion 140 of the light guide 40 positioned within the through bore 50. The shoulder 120 therefore rests on the corner portion 122 of the first face 14 of the printed circuit board 12. The light guide 40 is therefore supported both by the opaque film 96 and the first face 14 of the printed circuit board 12.

A laminated light guide and component carrier 10 of the present disclosure offers several advantages. These include the incorporation of individual light guides into preformed through apertures created in a printed circuit board, which are spaced apart and thereby maintain flexibility of the printed circuit board. The light guides can be affixed using adhesive provided on the face of an opaque layer applied to a second face of the printed circuit board. The light guides also incorporate textural features providing light reflectors that enhance light emitted by light emitting diodes. The light emitting diodes can also be partially positioned within cavities created in the printed circuit board, which reduces an overall thickness of the assembly.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A laminated light guide and component carrier, comprising:
   a printed circuit board having a light emitting diode connected to a first face of the printed circuit board;

a through bore created in the printed circuit board located proximate to the light emitting diode;

an opaque film applied to a second face of the printed circuit board oppositely directed with respect to the first face and having a portion partially overlapping the through bore; and a light guide having a first portion for receiving light from the light emitting diode and a second portion positioned within the through bore and contacting a portion of the opaque film partially overlapping the through bore, the light guide transmitting light from the light emitting diode through the bore and to the opaque film.

2. The laminated light guide and component carrier of claim 1, further including a light reflector defining an area of the light guide having a texturally modified area.

3. The laminated light guide and component carrier of claim 2, wherein the light reflector is positioned in the light guide directly abutting the light emitting diode.

4. The laminated light guide and component carrier of claim 2, wherein the texturally modified area of the light guide is entirely within an envelope of the light guide.

5. The laminated light guide and component carrier of claim 2, wherein:
the light emitting diode is recessed partially within a cavity created in the first face of the printed circuit board and directly abuts the light guide; and
a lens of the light emitting diode is positioned directly in alignment with the texturally modified area defining the light reflector.

6. The laminated light guide and component carrier of claim 2, wherein:
the light emitting diode is supported directly on the first face of the printed circuit board with the light guide extending above the first face of the printed circuit board and directly abutting the light emitting diode; and
the light emitting diode includes a lens aligned with the texturally modified area defining the light reflector.

7. The laminated light guide and component carrier of claim 1, further including a white film applied or ink printed onto the light guide without contacting the first face of the printed circuit board.

8. The laminated light guide and component carrier of claim 1, further including:
a touch capacitive circuit printed on the second face and positioned between the second face and the opaque film; and
multiple electrical traces printed on the second face connected to the touch capacitive circuit.

9. The laminated light guide and component carrier of claim 1, wherein the opaque film is applied to the second face of the printed circuit board using an adhesive, with the adhesive also present on the portion of the opaque film partially overlapping the through bore such that the light guide is connected to the portion of the opaque film using the adhesive.

10. The laminated light guide and component carrier of claim 1, wherein light generated by the light emitting diode is blocked from passing through the opaque film except at individual locations of indicia individually defining light transparent portions created in the opaque film.

11. A laminated light guide and component carrier, comprising:
a printed circuit board having a light emitting diode connected to a first face of the printed circuit board;
a through bore created in the printed circuit board proximate to the light emitting diode;

an opaque film applied using an adhesive to a second face of the printed circuit board oppositely directed with respect to the first face, the opaque film having a portion overlapping the through bore;
a light guide positioned within the through bore and affixed to the portion of the opaque film overlapping the through bore; and
a white film applied or ink printed onto the light guide without contacting the first face of the printed circuit board.

12. The laminated light guide and component carrier of claim 11, wherein the light guide includes a light reflector defining an area of the light guide having a texturally modified area.

13. The laminated light guide and component carrier of claim 12, wherein the white film is positioned proximate to the light reflector to maximize light reflected toward an opening created in the opaque film.

14. The laminated light guide and component carrier of claim 12, wherein the light emitting diode includes a lens aligned with the texturally modified area defining the light reflector.

15. The laminated light guide and component carrier of claim 11, wherein the light guide is preformed to slidably fit within the through bore created in the printed circuit board and partially extends above the first face of the printed circuit board.

16. The laminated light guide and component carrier of claim 11, wherein the light emitting diode is recessed partially within a cavity created in the first face of the printed circuit board and directly abuts the light guide.

17. The laminated light guide and component carrier of claim 11, wherein the light guide is affixed about a perimeter of the light guide to the adhesive present on the portion of the opaque film partially overlapping the through bore.

18. A laminated light guide and component carrier, comprising:
a printed circuit board having multiple light emitting diodes connected to a first face of the printed circuit board;
multiple through bores created in the printed circuit board each positioned proximate to one of the light emitting diodes;
an opaque film applied to a second face of the printed circuit board oppositely directed with respect to the first face, the opaque film having multiple portions, each of the portions individually overlapping one of the through bores;
multiple light guides each formed to be slidably received within one of the through bores and bonded about a perimeter of the light guide to the adhesive present on one of the multiple portions of the opaque film, the light guides each including a light reflector defining a texturally modified area;
a white film applied or ink printed onto each of the light guides without contacting the first face of the printed circuit board and positioned proximate to the light reflector of each of the light guides to maximize light reflected toward an opening created in the opaque film; and
an opaque polymeric material layer commonly applied over the first face of the printed circuit board, the light emitting diodes, the light guides and each white film, and extending beyond a perimeter of the printed circuit board.

19. The laminated light guide and component carrier of claim 18, further including:

multiple touch capacitive circuits printed on the second face of the printed circuit board connected to touch capacitive second electrical traces; and a touch capacitive sensor positioned proximate to each of the touch capacitive circuits.

20. The laminated light guide and component carrier of claim 19, further including a transparent cover layer applied over the touch capacitive circuits and each touch capacitive sensor and onto the second face of the printed circuit board opposite to the first face and a portion of the opaque polymeric material layer extending beyond the perimeter of the printed circuit board.

* * * * *